United States Patent
Weilguni et al.

(10) Patent No.: US 10,772,182 B2
(45) Date of Patent: Sep. 8, 2020

(54) DEVICE FOR PRODUCING A NON-THERMAL ATMOSPHERIC-PRESSURE PLASMA AND METHOD FOR THE FREQUENCY CONTROL OF A PIEZOELECTRIC TRANSFORMER

(71) Applicants: TDK Electronics AG, München (DE); relyon plasma GmbH, Regensburg (DE)

(72) Inventors: Michael Weilguni, Hagenberg (AT); Stefan Nettesheim, Regensburg (DE)

(73) Assignees: TDK ELECTRONICS AG, Munich (DE); RELYON PLASMA GMBH, Regensburg (DE)

( * ) Notice: Subject to any disclaimer, the term of this patent is extended or adjusted under 35 U.S.C. 154(b) by 0 days.

(21) Appl. No.: 16/494,271

(22) PCT Filed: Mar. 14, 2018

(86) PCT No.: PCT/EP2018/056424
§ 371 (c)(1),
(2) Date: Sep. 13, 2019

(87) PCT Pub. No.: WO2018/167163
PCT Pub. Date: Sep. 20, 2018

(65) Prior Publication Data
US 2020/0077502 A1    Mar. 5, 2020

(30) Foreign Application Priority Data
Mar. 14, 2017   (DE) .................. 10 2017 105 415

(51) Int. Cl.
*H05H 1/24*  (2006.01)
*H01L 41/04*  (2006.01)
*H01L 41/107*  (2006.01)

(52) U.S. Cl.
CPC .......... *H05H 1/2475* (2013.01); *H01L 41/044* (2013.01); *H01L 41/107* (2013.01); *H05H 2001/2481* (2013.01)

(58) Field of Classification Search
CPC ..... H01L 41/04; H01L 41/042; H01L 41/044; H01L 41/107; H05H 1/24; H05H 1/2475;
(Continued)

(56) References Cited

U.S. PATENT DOCUMENTS 5,866,968 A * 2/1999 Mech ................... H01L 41/044
                                                              310/314
6,016,052 A * 1/2000 Vaughn ................ H01L 41/044
                                                              310/318
(Continued)

FOREIGN PATENT DOCUMENTS

DE    19827948 A1    1/2000
DE    19836561 A1    2/2000
(Continued)

OTHER PUBLICATIONS

Jim Williams, et al., "Ultracompact LCD Backlight Inverters; A Svelte Beast Cuts High Voltage Down to Size," Linear Technology; Application Note 81, Sep. 1999, pp. 1-24.

*Primary Examiner* — Thai Pham
(74) *Attorney, Agent, or Firm* — Slater Matsil, LLP (57) ABSTRACT

A device for producing a non-thermal atmospheric-pressure plasma are a method for frequency control of a piezoelectric transformer are disclosed. In an embodiment a device includes a piezoelectric transformer, an activating circuit configured to apply an AC voltage at an activating frequency to the piezoelectric transformer as an input voltage and a field probe configured to measure a field strength of an electric field produced by the piezoelectric transformer, wherein the activating circuit is configured to adapt the
(Continued)

activating frequency based on the measurement results of the field probe such that a field strength is maximized.

17 Claims, 4 Drawing Sheets

(58) Field of Classification Search
CPC ........ H05H 2001/2481; H05B 41/2827; H05B 41/2828; H05B 41/3925
See application file for complete search history.

(56) References Cited

U.S. PATENT DOCUMENTS

| | | | |
|---|---|---|---|
| 6,144,139 A * | 11/2000 | Noma | H05B 41/2822 310/316.01 |
| 9,705,064 B2 | 7/2017 | Kraxner et al. | |
| 2016/0027987 A1 * | 1/2016 | Kraxner | H01L 41/044 310/318 |
| 2019/0008027 A1 | 1/2019 | Weilguni et al. | |
| 2019/0198746 A1 * | 6/2019 | Weilguni | H01L 41/044 |

FOREIGN PATENT DOCUMENTS

| | | |
|---|---|---|
| DE | 102013103159 A1 | 10/2014 |
| DE | 102015112410 A1 | 2/2017 |
| EP | 2139302 A1 | 12/2009 |

\* cited by examiner

DEVICE FOR PRODUCING A NON-THERMAL ATMOSPHERIC-PRESSURE PLASMA AND METHOD FOR THE FREQUENCY CONTROL OF A PIEZOELECTRIC TRANSFORMER

This patent application is a national phase filing under section 371 of PCT/EP2018/056424, filed Mar. 14, 2018, which claims the priority of German patent application 102017105415.4, filed Mar. 14, 2017, each of which is incorporated herein by reference in its entirety.

TECHNICAL FIELD

The invention relates to a device for producing a non-thermal atmospheric-pressure plasma and to a method for the frequency control of a piezoelectric transformer.

SUMMARY OF THE INVENTION

Piezoelectric transformers, in particular Rosen-type transformers, can be used for producing plasma. In plasma generation, the maximum efficiency is achieved when the piezoelectric transformer is activated at a frequency that corresponds to the series resonant frequency of the transformer. However, the series resonant frequency is not constant, but depends on various parameters. If a plasma is ignited at an output-side end face of the transformer, this interacts with the transformer as a load and thereby influences the impedance of the transformer. As a result, there is a shift in the series resonance as compared with operation of the transformer with no load, during which the applied voltage is not sufficient for igniting a plasma. The working surroundings, for example the process gas used or the temperature of the transformer, also influence the series resonant frequency.

Furthermore, the input voltage applied to the transformer may also influence the series resonant frequency. Therefore, information on the component is required for finding the respective series resonant frequency that leads to a maximum output voltage.

Since the piezoelectric transformer is designed for igniting a plasma, the voltage cannot be tapped on the output side of the transformer in order in this way to bring about a maximization of the output voltage. In this case, the voltage could either be tapped by means of a rigid soldered connection, which is applied to the output side, or by means of a conductive rubber, which is pressed onto the output side. The tapping of the output voltage would dampen a vibration of the transformer, and thus reduce the high voltage. Furthermore, it would lead to the risk of plasma ignition on the tapping line.

German Patent Application DE 10 2013 103 159 A1 proposes using an input signal applied to the piezoelectric transformer for controlling the piezoelectric transformer and in this way finding the optimum working frequency. In this case, an evaluation of the phase information of the input signal is required. Such a solution entails a not inconsiderable expenditure in terms of circuitry. What is more, such a solution is only suitable for sinusoidal input signals.

Embodiments provide an improved device for producing a non-thermal atmospheric-pressure plasma. Further embodiments provide an improved method for the frequency control of a piezoelectric transformer.

In various embodiments a device for producing a non-thermal atmospheric-pressure plasma which comprises a piezoelectric transformer, an activating circuit and a field probe is proposed. The activating circuit is designed to apply an AC voltage at an activating frequency to the piezoelectric transformer as an input voltage. The field probe is designed to measure a field strength of an electric field produced by the piezoelectric transformer. The activating circuit is designed to adapt the activating frequency in a way that takes into account the measurement results of the field probe in such a way that the field strength is maximized.

A maximization of the field strength of the electric field produced by the piezoelectric transformer is synonymous with a maximization of the voltage produced in the output region of the piezoelectric transformer.

The device makes use of the high electric field strengths that are produced in the vicinity of the output region of the piezoelectric transformer. A measurement of this field strength can be performed without thereby influencing the work of the transformer by tapping power in the output region of the transformer. In particular, a measurement of the field strength can be performed without thereby dampening the vibration of the piezoelectric transformer.

The signal measured by the field probe may be proportional to the voltage that is produced in the output region of the piezoelectric transformer. In this way it is possible to dispense with a laborious input-side impedance and/or phase measurement. As a result, a circuit for the frequency control of the transformer can be simplified.

In addition, a frequency adaptation by means of measuring the electric field strength can be applied independently of the signal shape of the input voltage. For example, it is not necessary that the input voltage is a sinusoidal signal. Rather, the input voltage may be any periodic signal, for example the input voltage may be a rectangular-wave signal or a triangular-wave signal.

The field probe may be integrated in a housing of the device for producing a non-thermal atmospheric-pressure plasma. The field probe may be arranged in the direct proximity of the piezoelectric transformer. For example, the distance between the piezoelectric transformer and the field probe may be less than 5 cm. Preferably, the distance between the piezoelectric transformer and the field probe may be less than 1 cm. A gap may remain between the field probe and the piezoelectric transformer.

The field probe may be formed by a metal area, an alternating electric field produced by the piezoelectric transformer producing an AC voltage in the metal area. The device may have a measuring unit, which is designed to measure this voltage and infer the field strength from it.

The piezoelectric transformer may have an input region, to which the input voltage can be applied. The piezoelectric transformer may have an output region, in which a high voltage is produced when the input voltage is applied to the input region, a plasma being ignited by the high voltage. In particular, the transformer may be a Rosen-type transformer. The transformer may be surrounded by a process gas. During the plasma ignition, an excitation or ionization of molecules or atoms of the process gas may be brought about by the high voltage produced. Furthermore, radicals may be formed from the components of the process gas. In the case of ambient air as the process gas, OH radicals, nitrogen oxides and ozone are produced in particular in the plasma.

The field probe may be arranged close to the output region of the piezoelectric transformer. For example, the distance between the field probe and the output region may be between 0.1 mm and 1 cm. A gap is arranged between the field probe and the output region. The gap may be filled with the process gas. By arranging the field probe close to the output region, it can be ensured that the electric field measured by the field probe has a field strength that is proportional to the output voltage of the piezoelectric transformer. If the field probe is arranged close to the output region, it can be ensured that the electric field produced by the piezoelectric transformer represents the dominant effect for the electric field strength at this location and any other electric fields that could influence a measurement of the field strength by the field probe as disturbing effects can be ignored.

The field probe may be connected to a measuring unit, which is designed to determine a peak value of the electric field strength and/or a mean value of the electric field strength. The activating circuit may have a controller, which is designed to vary the activating frequency depending on the determined peak value and/or the determined mean value. The measuring unit and the activating circuit may be formed on a single circuit board. The measuring unit and the activating circuit may be formed by a single microchip.

The field probe may be integrated in a circuit board. The circuit board may comprise a non-conducting carrier material. The non-conducting material of the circuit board may provide an insulation between the field probe and the piezoelectric transformer. Accordingly, plasma ignitions between the transformer and the field probe can be avoided. The field probe may be arranged either on an underside of the circuit board that is facing away from the piezoelectric transformer or in an inner layer of a multilayered circuit board.

The circuit board may have a metal coating, which is arranged on a side of the circuit board that is facing away from the piezoelectric transformer. The metal coating may be a copper coating. The metal coating may form a probe area. A voltage can be induced in the probe area by an alternating electric field produced by the piezoelectric transformer. The probe area may be connected to the measuring unit, the measuring unit being designed to measure the voltage induced in the probe area. The metal coating may also form a ground area, which is connected to a reference potential, in particular to ground.

The circuit board may be multilayered, it being possible for the field probe to be formed by an inner layer of the circuit board. A layer that is arranged between two layers of a non-conducting carrier material may be referred to here as an inner layer. The forming of the field probe by an inner layer allows a particularly high spatial resolution of the measurement to be achieved.

The AC voltage may comprise a triangular signal or a rectangular signal. Signals of this type can be produced particularly easily, and accordingly make it possible to use a simple driver for the activation. Since it is not necessary to resort to phase information for determining the optimum working frequency of the piezoelectric transformer, the AC voltage may be any desired periodic signal. In particular, it is not absolutely necessary that the AC voltage is a sinusoidal signal.

The activating circuit may be designed to adapt the activating frequency in a way that takes into account the measurement results of the field probe in such a way that the field strength is maximized when the device is switched on. The activating circuit may also be designed to perform a correction of the activating frequency in a way that takes into account the measurement results of the field probe at fixed time intervals during ongoing operation of the device, the activating frequency being adapted once again in such a way that the field strength is maximized.

During ongoing operation, the working conditions may change, whereby the series resonant frequency of the piezoelectric transformer, and consequently its optimum working frequency, is shifted. This may be caused for example by a temperature change or a load in the proximity of the transformer. By repeating the adaptation of the activating frequency at periodic time intervals during ongoing operation, it can be ensured that the activating frequency is continually adapted to the optimum working frequency.

The device may serve for producing excited molecules, ions or radicals. The device may serve for producing OH radicals and/or nitrogen oxide and/or ozone.

According to a further aspect, embodiments of the present invention relate to a method for the frequency control of a piezoelectric transformer. This may be the transformer described above. Accordingly, each functional or structural feature that has been disclosed in connection with the transformer may also apply to the method. Conversely, each feature that is disclosed in connection with the method may also apply to the transformer.

Various further embodiments provide a method comprising the following steps:

applying an AC voltage to the piezoelectric transformer at an initial activating frequency f0, changing the activating frequency in steps, the field strength of an electric field produced by the piezoelectric transformer being determined in each case by a field probe, determining the activating frequency at which the maximum field strength is obtained, operating the piezoelectric transformer at the determined activating frequency for which the maximum field strength is obtained.

One advantage of the method is the low inertia of a control algorithm that controls the frequency at which the transformer is operated. If a coil current were used instead as the controlled variable, the inertia of the control algorithm would be much greater.

The steps may in this case be carried out in the sequence specified here.

The method can consequently make it possible to continually control the frequency of the piezoelectric transformer to its series resonant frequency, and consequently its optimum working frequency. As already discussed above, the method makes it possible to perform a control of the activating frequency independently of the signal shape of the activating signal. The method can be carried out without thereby dampening the vibration of the piezoelectric transformer. In addition, the method can be carried out with an activating circuit of quite a simple design.

The determination of the activating frequency at which the maximum field strength is obtained may be repeated at fixed time intervals during the ongoing operation of the device. In this way, changes of the working conditions of the device can be taken into account and the activating frequency can be continually set to the optimum value.

When changing the activating frequency in steps, the activating frequency may be increased or reduced in steps from the initial activating frequency f0 by an increment $\Delta f1$ until reaching the activating frequency at which the maximum field strength for the increment $\Delta f1$ is obtained, while subsequently the activating frequency is increased or reduced in steps from this activating frequency by an increment $\Delta f2$ until reaching the activating frequency at which the maximum field strength for the increment $\Delta f2$ is obtained, $\Delta f2$ being less than $\Delta f1$. Accordingly, the step-by-step adaptation may be carried out initially with large increments and then with increments that become increasingly smaller. By using at first large increments and later increasingly smaller increments, the optimum activating frequency can be found quickly.

The piezoelectric transformer of which the frequency is controlled by the method described above may be used for producing a non-thermal atmospheric-pressure plasma.

The plasma may be used for producing excited molecules, ions or radicals. The plasma may be used for producing OH radicals and/or nitrogen oxide and/or ozone.

The field probe may be embedded in a puncture-proof insulator. The puncture-proof insulator may in this case be designed in particular to prevent dielectric breakdown between the transformer and the field probe. The puncture-proof insulator in which the field probe is embedded may be connected to the piezoelectric transformer in a material-bonded manner. The material-bonded connection may be for example an adhesive connection. The material-bonded connection may make it possible to arrange the field probe in the direct proximity of the piezoelectric transformer. In this way, a field produced by the transformer can be measured particularly accurately.

BRIEF DESCRIPTION OF THE DRAWINGS

The present invention is described in more detail below on the basis of the figures.

DETAILED DESCRIPTION OF ILLUSTRATIVE EMBODIMENTS

Figure 1:
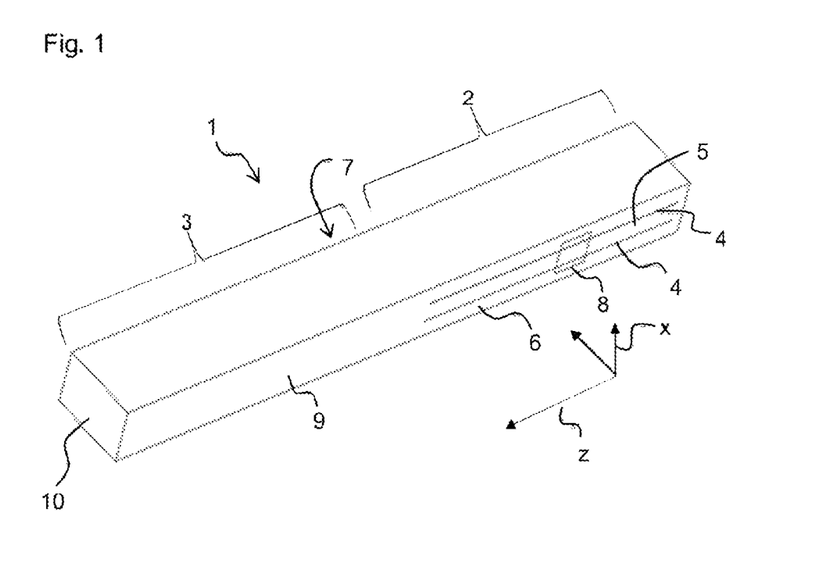
FIG. 1 shows a piezoelectric transformer in a perspective view.

FIG. 1 shows a piezoelectric transformer 1 in a perspective view. The piezoelectric transformer 1 may be used in particular in a plasma generator for producing non-thermal atmospheric-pressure plasma.

A piezoelectric transformer 1 is a type of tuned transformer which is based on piezoelectricity and, by contrast with the conventional magnetic transformers, represents an electromechanical system. The piezoelectric transformer 1 is, for example, a Rosen-type transformer.

The piezoelectric transformer 1 has an input region 2 and an output region 3, the output region 3 adjoining the input region 2 in a longitudinal direction z. In the input region 2, the piezoelectric transformer 1 has electrodes 4, to which an AC voltage can be applied. The electrodes 4 extend in the longitudinal direction z of the piezoelectric transformer 1. The electrodes 4 are stacked in alternation with a piezoelectric material 5 in a stacking direction x, which is perpendicular to the longitudinal direction z. The piezoelectric material 5 is in this case polarized in the stacking direction x.

The electrodes 4 are arranged in the interior of the piezoelectric transformer 1 and also referred to as inner electrodes. The piezoelectric transformer 1 has a first side face 6 and a second side face 7, which is opposite from the first side face 6. On the first side face 6, a first outer electrode 8 is arranged. On the second side face 7, a second outer electrode (not shown) is arranged. The inner electrodes 4 are electrically contacted either with the first outer electrode 8 or the second outer electrode in alternation in the stacking direction x.

The input region 2 may be activated by a low AC voltage, which is applied between the electrodes 4. On account of the piezoelectric effect, the AC voltage applied on the input side is initially converted into a mechanical vibration. The frequency of the mechanical vibration is in this case essentially dependent on the geometry and the mechanical structure of the piezoelectric transformer 1.

The output region 3 comprises piezoelectric material 9 and is free from inner electrodes. The piezoelectric material 9 is polarized in the longitudinal direction z in the output region 3. The piezoelectric material 9 of the output region 3 may be the same material as the piezoelectric material 5 of the input region 2, while the piezoelectric materials 5 and 9 may differ in their direction of polarization. In the output region 3, the piezoelectric material 9 is formed into a single monolithic layer, which is completely polarized in the longitudinal direction z. In this case, the piezoelectric material 9 has only a single direction of polarization in the output region 3.

If an AC voltage is applied to the electrodes 4 in the input region 2, there forms within the piezoelectric material 5, 9 a mechanical wave, which by the piezoelectric effect produces an output voltage in the output region 3. The output region 3 has an output-side end face 10. Consequently, in the output region 3 an electrical voltage is produced between the end face 10 and the end of the electrodes 4 of the input region 2. A high voltage is in this case produced at the output-side end face 10. In this case, a high potential difference also occurs between the output-side end face and a surrounding area of the piezoelectric transformer, sufficient to produce a strong electric field that ionizes a process gas.

In this way, the piezoelectric transformer 1 produces high electric fields that are capable of ionizing gases or liquids by electrical excitation. In this case, atoms or molecules of the respective gas or of the respective liquid are ionized and form a plasma. An ionization occurs whenever the electric field strength at the surface of the piezoelectric transformer 1 exceeds the ignition field strength of the plasma. In this case, the term ignition field strength of a plasma indicates the field strength that is required for ionizing the atoms or molecules.

Figure 2:
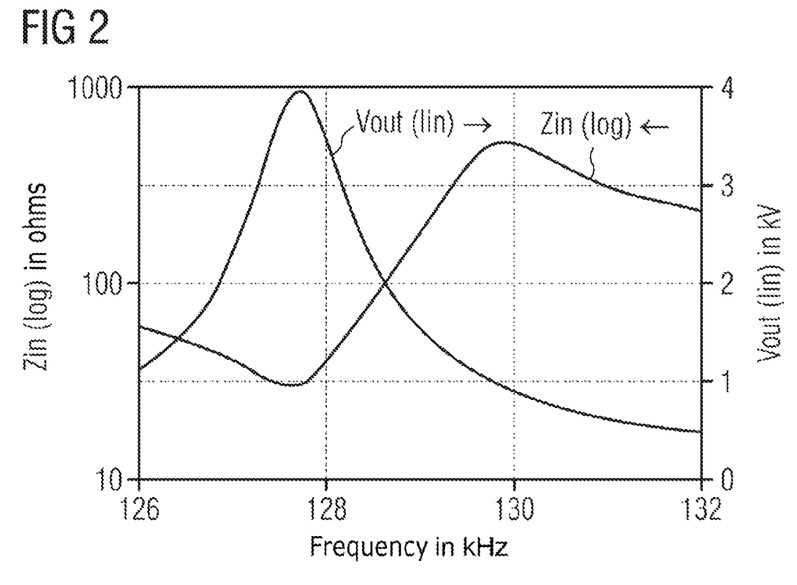
FIG. 2 shows a diagram in which the variation of the impedance and the variation of the output voltage of the piezoelectric transformer are represented.

FIG. 2 shows a diagram in which the variation of the impedance and voltage of the piezoelectric transformer 1 is represented. The curve Zin(log) shows the variation of the input impedance of the piezoelectric transformer 1 in dependence on the frequency of the applied input voltage, plotted on a logarithmic scale. The curve Zin(log) reaches a minimum at the series resonant frequency of the piezoelectric transformer 1. Furthermore, the curve Zin(log) reaches a maximum at the parallel resonant frequency of the piezoelectric transformer 1.

In FIG. 2, there is also shown the curve Vout(lin), which indicates the variation of the output voltage that is produced at the output-side end face 10 of the piezoelectric transformer 1, in dependence on the frequency of the applied input voltage. The output voltage reaches its maximum at the series resonant frequency of the piezoelectric transformer 1. Accordingly, the greatest efficiency in the plasma production is achieved when the frequency of the input voltage that is applied to the piezoelectric transformer 1 corresponds to the series resonant frequency of the piezoelectric transformer 1.

However, the series resonant frequency is not in any way constant, but rather depends on numerous parameters. In particular, a plasma ignited by the piezoelectric transformer 1 may have the effect of forming a load that influences the impedance of the transformer 1 and accordingly may lead to a changing of the series resonant frequency of the transformer 1. In addition, the series resonant frequency is also dependent on the working surroundings in which the piezoelectric transformer 1 is used. For example, the process gas used and the temperature of the piezoelectric transformer 1 may influence the series resonant frequency.

Figure 3:
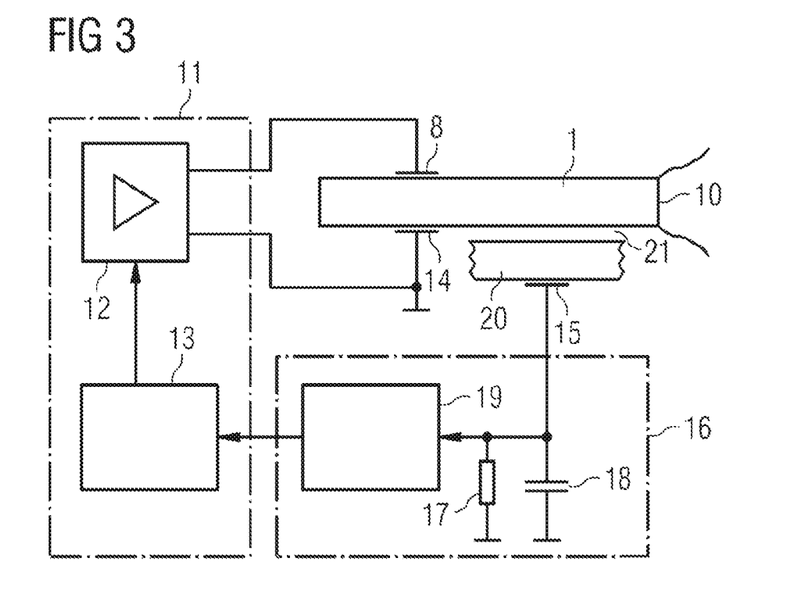
FIG. 3 schematically shows a device for producing a non-thermal atmospheric-pressure plasma.

FIG. 3 shows a schematic representation of a device for producing a non-thermal atmospheric-pressure plasma that has the piezoelectric transformer 1. The device also has an activating circuit 11, which is designed to apply an AC voltage at an activating frequency to the piezoelectric transformer 1 as an input voltage. The aim of embodiments of the present invention is thus to make it possible to continually adapt the activating frequency in such a way that the piezoelectric transformer 1 is operated at its current series resonant frequency. The activating circuit 11 has a driver 12 and a controller 13. The driver 12 is designed to apply the input voltage to the piezoelectric transformer 1. The driver 12 is connected to the outer electrodes 8, 14 of the piezoelectric transformer 1. The controller 13 is designed to activate the driver 12 and thereby in particular fix the activating frequency of the input voltage.

The device also has a field probe 15, which is designed to measure a field strength of the electric field produced by the piezoelectric transformer 1. The field probe 15 is arranged in the direct proximity of the output region 3 of the piezoelectric transformer 1. The field probe 15 provides a signal proportional to the output voltage. Accordingly, the high voltage produced at the output-side end face 10 of the piezoelectric transformer 1 can be directly inferred on the basis of the field strength determined by the field probe 15.

It can be made possible by the measuring of the electric field strength by means of the field probe 15 to control the activating frequency continually to an optimum activating frequency. At the optimum activating frequency, the efficiency of the device with regard to plasma production is maximized.

The field probe 15 is also connected to a measuring unit 16, which is designed to evaluate the signals detected by the field probe 15. In this case, the measuring unit 16 may be designed to determine a peak value of the electric field strength measured by the field probe 15 and/or a mean value of the electric field strength. The measuring unit 16 has a resistor 17, connected to a reference potential, and also a capacitor 18, connected to the reference potential. In an alternative embodiment, it is possible to dispense either with the resistor 17 or the capacitor 18.

The measuring unit 16 also has a rectifier 19. The signal detected by the field probe 15 is an AC signal, the frequency of which corresponds to the activating frequency of the input voltage applied to the piezoelectric transformer 1. The rectifier 19 is designed to rectify the signal. Accordingly, the rectifier 19 is designed to convert an AC signal transmitted from the field probe 15 to the measuring unit 16 into a DC signal.

The measuring unit 16 is connected to the activating circuit 11. In particular, the measuring unit 16 is connected to the controller 13 of the activating circuit 11. The controller 13 may be a control loop, which is, for example, formed on a microcontroller. The controller 13 is designed to fix with which activating frequency the driver 12 activates the piezoelectric transformer 1.

The controller 13 may be designed to increase the activating frequency in steps, beginning from an initial activating frequency f0, which is chosen such that it is in any event less than the series resonant frequency of the piezoelectric transformer 1. In this case, the respective electric field strength v(fn) is determined for each chosen activating frequency fn. The controller 13 may be designed to increase the activating frequency in steps by a fixed increment $\Delta f1$. In this case, the activating frequency successively assumes the values f0, f1=f0+$\Delta f1$, f2=f1+$\Delta f1$, f3=f2+$\Delta f1$, etc. The controller 13 is designed to increase the activating frequency until a local voltage maximum vmax,n=max(v(fn),vmax,n−1) has been determined.

Once the local voltage maximum vmax,n has been found, a further adaptation of the activating frequency can be performed with a reduced increment $\Delta f2$. Chosen as the starting value for the further adaptation is an initial activating frequency fn(max)−1, which is close to the frequency fn(max) of the local voltage maximum and lies below this frequency. The reduced increment $\Delta f2$ may, for example, be half the size of the increment $\Delta f1$ In the further adaptation, the values fn(max)−1, f1=fn(max)−1+$\Delta f2$, f2=f1−$\Delta f2$, f3=f2+$\Delta f2$ etc. are consequently successively chosen for the activating frequency. In this case, a local voltage maximum of the electric field strength with a thus improved frequency resolution is again determined. This principle can be repeated until a maximum with the desired frequency resolution is found.

Alternatively, it is also possible that the initial activating frequency f0 is chosen such that it is in any event greater than the series resonant frequency of the piezoelectric transformer 1. In this case, the controller may perform a reduction of the activating frequency in steps and in the same way determine the optimum activating frequency. Also in this case, the adaptation in steps can be performed a number of times, the increment being reduced in each adaptation cycle.

The adaptation of the activating frequency may be performed for the first time when the device is switched on. Furthermore, this adaptation could be repeated at regular time intervals during the ongoing operation of the device. As a result, it could be also taken into account that, when there are changing working conditions, a change of the impedance of the transformer 1, and consequently of the series resonant frequency, also takes place.

The field probe 15 is integrated on a circuit board 20. The circuit board is arranged parallel to the output region 4 of the piezoelectric transformer 1, there being a gap 21 between the circuit board 20 and the piezoelectric transformer 1. The circuit board 20 may extend in the longitudinal direction z beyond the output-side end face 10 of the output region 3. In the opposite direction, the circuit board 20 may protrude into the input region 2.

Figure 4:
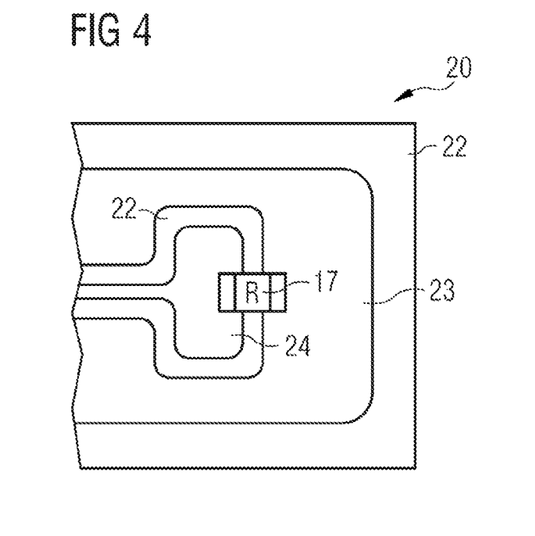
FIG. 4 shows a field probe.

FIG. 4 shows the underside of the circuit board 20.

The circuit board 20 has a layer of a non-conducting carrier material 22. The non-conducting carrier material 22 may be, for example, FR4 or some other insulating material. The field probe 15 is formed by a metallization of the side of the circuit board 20 that is facing away from the piezoelectric transformer 1. It is thereby ensured that a plasma ignition does not occur between the transformer 1 and the field probe 15, since the circuit board 20 acts as an insulator. The gap 21 and the circuit board 20, which are arranged between the field probe 15 and the transformer 1, each act as a capacitance.

On the side of the circuit board 20 that is facing away from the transformer 1 there is a metal coating. The metal coating may be a copper coating. The metal coating is divided into a ground area 23 and a probe area 24. The ground area 23 and the probe area 24 are separated by an area of the insulating carrier material.

The arrangement of the metal coating on the side of the circuit board 20 that is facing away from the transformer 1 allows prevention of any igniting of the plasma against the metal coating. In particular, the circuit board 20 is arranged at a distance from the transformer 1 that is great enough to prevent igniting toward the underside of the circuit board 20.

The ground area 23 is connected to a reference potential, for example, of a grounding system. The probe area 24 is connected to the measuring unit 16. The ground area 23 and the probe area 24 are connected to one another by way of the resistor 17, which is arranged as a discrete component on the underside of the circuit board 20. Alternatively or in addition to the resistor 17, the ground area 23 and the probe area 24 may also be connected by a capacitor. If an electric field is produced by the piezoelectric transformer 1, the field induces a voltage in the probe area 24. The measuring unit 16 is designed to measure the voltage induced.

The gap 21 between the transformer 1 and an upper side of the circuit board 20 that is facing the transformer 1 forms a capacitor. The circuit board 20 also likewise forms a capacitor with respect to the probe area 24. The capacitances of the two capacitors together with the resistor 17, which is arranged as a discrete component on the underside of the circuit board 20, form a voltage divider. By way of the voltage divider, the probe area 24 is connected to ground in a defined manner and the AC voltage induced in the probe area 24 is available for measurement.

Figure 5:
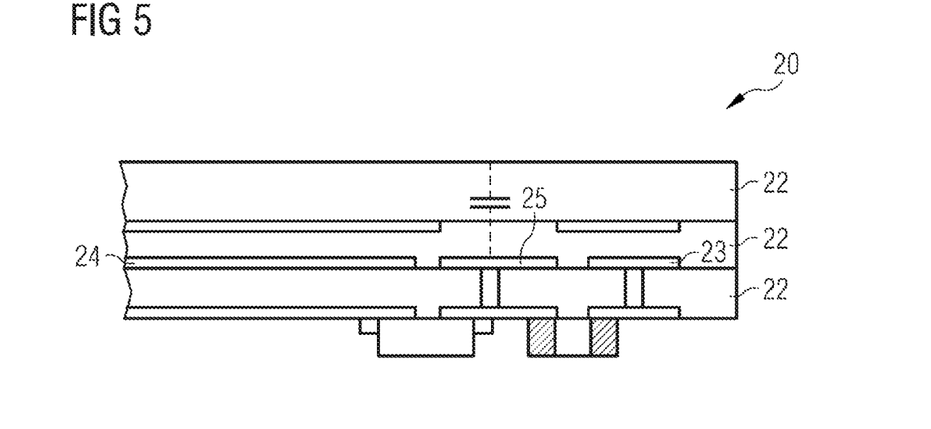
FIG. 5 shows a circuit board in which a field probe is integrated, in a cross section.
Figure 6:
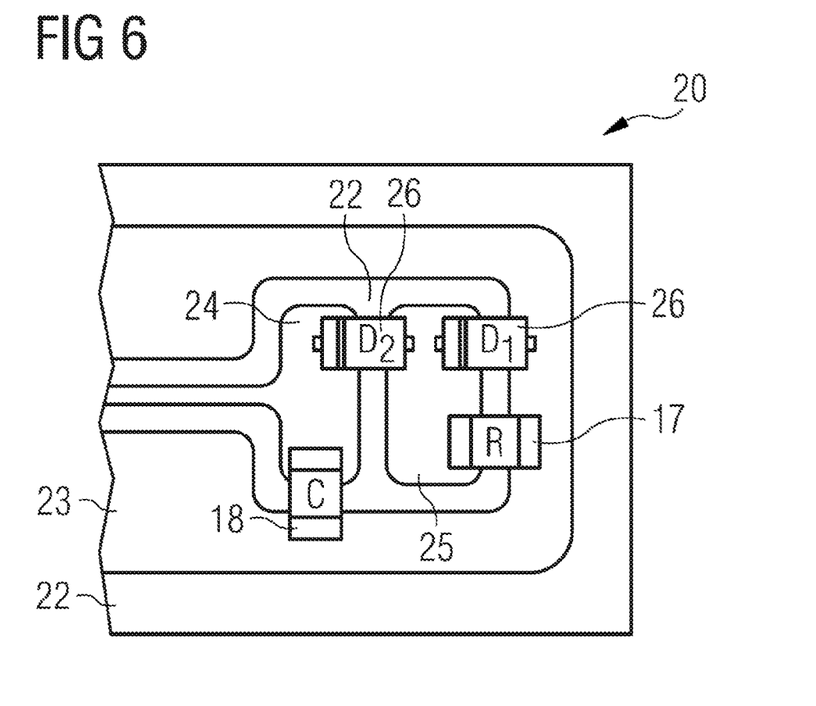
FIG. 6 shows the underside of the circuit board shown in FIG. 5.
Figure 7:
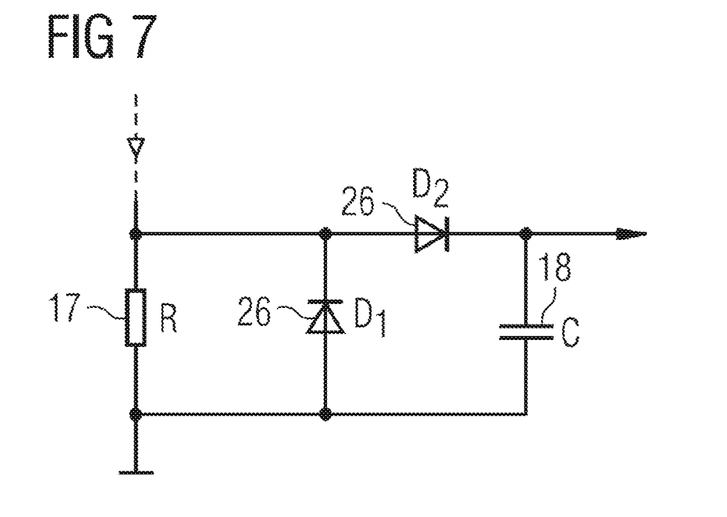
FIG. 7 shows an equivalent circuit diagram.

FIGS. 5 to 7 show a second exemplary embodiment of a circuit board 20, in which a field probe 15 is integrated. In this case, FIG. 5 shows a cross section through the circuit board 20. FIG. 6 shows a circuit board 20 in a view from below, a metallization of an inner layer of the circuit board 20 and the discrete components arranged on the underside of the circuit boards 20 being represented. FIG. 7 shows an equivalent circuit diagram of the circuit board 20.

The circuit board 20 is multilayered, in particular four-layered. The circuit board has three layers of the non-conducting carrier material 22. Discrete components are also arranged on the underside of the circuit board 20. The probe area 24 is formed by a metal layer in an inner layer of the multilayered circuit board 20. Also arranged in the inner layer of the multilayered circuit board 20 is a second metal area 25, which is separated from the probe area 24 by the non-conducting carrier material 22. Also arranged in the inner layer is a ground area 23. The ground area 23 is connected to the reference potential, for example, of the grounding system. The probe area 24 is connected to the measuring unit 16. The probe area 24, the second metal area 25 and the ground area 23 may consist in particular of copper.

Discrete components are arranged on the underside of the multilayered circuit board 20 that is facing away from the piezoelectric transformer 1. The discrete components are two diodes 26, a resistor 17 and a capacitor 18. It can be seen from the equivalent circuit diagram shown in FIG. 7 how the probe area 24, the second metal area 25, the ground area 23 and the discrete components are interconnected with one another. The discrete components may form a rectifier. Accordingly, the rectifier 19 may be integrated in the circuit board 20. Alternatively or in addition, the discrete components may form a filter capacitor. A filter capacitor, also known as a smoothing capacitor, is a capacitor which is placed parallel to the load resistor and reduces the residual ripple of the rectified voltage downstream of a rectifier circuit.

The second exemplary embodiment makes improved spatial resolution of the measurement possible.

The invention claimed is:

1. A device for producing a non-thermal atmospheric-pressure plasma, the device comprising:
    a piezoelectric transformer;
    an activating circuit configured to apply an AC voltage at an activating frequency to the piezoelectric transformer as an input voltage; and
    a field probe configured to measure a field strength of an electric field produced by the piezoelectric transformer,
    wherein the activating circuit is configured to adapt the activating frequency based on the measurement results of the field probe in such a way that the field strength is maximized when the device is switched on.

2. The device according to claim 1,
    wherein the piezoelectric transformer has an input region to which the input voltage is applicable, and
    wherein the piezoelectric transformer has an output region configured to produce a high voltage when the input voltage is applied to the input region so that a plasma is ignited by the high voltage.

3. The device according to claim 2, wherein the field probe is closely arranged to the output region.

4. The device according to claim 1,
    wherein the field probe is connected to a measuring unit, which is configured to determine at least one of a peak value of the electric field strength or a mean value of the electric field strength,
    wherein the activating circuit comprises a controller, which is configured to vary at least one of the activating frequency depending on the determined peak value or the determined mean value.

5. The device according to claim 1, wherein the field probe is integrated in a circuit board.

6. The device according to claim 5, wherein the circuit board has a metal coating that is arranged on a side of the circuit board that faces away from the piezoelectric transformer.

7. The device according to claim 5, wherein the circuit board is multi-layered and the field probe is formed by an inner layer of the circuit board.

8. The device according to claim 1, wherein the AC voltage comprises a rectangular signal or a triangular signal.

9. The device according to claim 1, wherein the activating circuit is configured to:
    adapt the activating frequency such that, based on measurement results of the field probe, the field strength is maximized when the device is switched on, and
    perform a correction of the activating frequency such that, based on the measurement results of the field probe at fixed time intervals during ongoing operation of the device, the activating frequency is adapted once again in such a way that the field strength is maximized.

10. The device according to claim 1, wherein the device is configured to produce excited molecules, ions or radicals.

11. The device according to claim 1, wherein the device is configured to produce at least one of OH radicals or nitrogen or ozone.

12. A method for frequency control of a piezoelectric transformer, the method comprising:
    applying an AC voltage to the piezoelectric transformer at an initial activating frequency $f_0$;

changing an activating frequency in steps from the initial activating frequency until a determined activating frequency is reached;

determining a field strength of an electric field produced by the piezoelectric transformer for each activating frequency by a field probe;

determining the activating frequency at which the maximum field strength is obtained; and operating the piezoelectric transformer at the determined activating frequency for which the maximum field strength is obtained.

13. The method according to claim 12, wherein determining the activating frequency at which the maximum field strength is obtained comprises repeatedly determining the activating frequency at which the maximum field strength is obtained at fixed time intervals.

14. The method according to claim 12, wherein changing the activating frequency comprises:

increasing or reducing the activating frequency in steps from the initial activating frequency $f_0$ by a first increment $\Delta f_1$ until the activating frequency is reached at which the maximum field strength for the first increment $\Delta f_1$ obtained, and subsequently increasing or reducing the activating frequency in steps from this initial activating frequency by a second increment $\Delta f_2$ until the activating frequency is reached at which the maximum field strength for the second increment $\Delta f_2$ is obtained, wherein the second increment $\Delta f_2$ being is less than the first increment $\Delta f_1$.

15. The method according to claim 12, further comprising using the piezoelectric transformer for producing a non-thermal atmospheric pressure plasma.

16. The method according to claim 15, further comprising using the plasma for producing excited molecules, ions or radicals.

17. The method according to claim 15, further comprising using the plasma for producing at least one of hydroxyl radicals or nitrogen oxide or ozone.

* * * * *